US012328830B2

(12) United States Patent
Su

(10) Patent No.: US 12,328,830 B2
(45) Date of Patent: Jun. 10, 2025

(54) ANTI-TAMPERING MECHANISM AND ELECTRONIC DEVICE

(71) Applicant: Nanning FuLian FuGui Precision Industrial Co., Ltd., Nanning (CN)

(72) Inventor: Ying-Feng Su, New Taipei (TW)

(73) Assignee: Nanning FuLian FuGui Precision Industrial Co., Ltd., Nanning (CN)

( * ) Notice: Subject to any disclaimer, the term of this patent is extended or adjusted under 35 U.S.C. 154(b) by 234 days.

(21) Appl. No.: 18/211,633

(22) Filed: Jun. 20, 2023

(65) Prior Publication Data

US 2024/0431043 A1   Dec. 26, 2024

(51) Int. Cl.
*H05K 5/02* (2006.01)

(52) U.S. Cl.
CPC ................... *H05K 5/0208* (2013.01)

(58) Field of Classification Search
CPC ........ H05K 5/0208; H05K 1/181; H05K 7/14; H05K 1/0275; G06F 21/86; H01H 2239/032
USPC ........................................................ 361/672
See application file for complete search history.

(56) References Cited

U.S. PATENT DOCUMENTS

2005/0224329 A1* 10/2005 Milo ................. E05B 17/22
200/341
2019/0012491 A1   1/2019 Su et al.

FOREIGN PATENT DOCUMENTS

CN        107426926 A    12/2017

* cited by examiner

*Primary Examiner* — James Wu
*Assistant Examiner* — Dakota M Talbert
(74) *Attorney, Agent, or Firm* — ScienBiziP, P.C.

(57) ABSTRACT

An anti-tampering mechanism includes a first bracket, a second bracket, and multiple conductive members. The second bracket is moveably covered on the first bracket, the multiple conductive members are randomly disposed in a plurality of receptacles in the second bracket. The second bracket is configured to deform to move toward the first bracket under pressure of a circuit board, the circuit board contacts with the conductive members to form an electrical connection, and the second bracket is further configured to restore to move away from the first bracket after the circuit board being removed, causing the conductive members to pop out of the receptacles. An electronic device including the anti-tampering mechanism is also provided to prevent unauthorized personnel from continuing to use the electronic device after disassembly or tampering the electronic device.

15 Claims, 6 Drawing Sheets

ANTI-TAMPERING MECHANISM AND ELECTRONIC DEVICE

FIELD

The subject matter relates to electronic device protection technologies, and more particularly to an anti-tampering mechanism and an electronic device.

BACKGROUND

In order to prevent unauthorized persons from illegally disassembling electronic products and tampering with the internal systems and data of the electronic products, obtaining technical information of the electronic products, or using the tampered systems to steal confidential information, it is usually required that the circuit on the main board of the electronic product can detect that the outer shell has been illegally opened after the outer shell of the electronic product is opened, and execute a program to stop the operation, so that the system that has been unauthorized opened cannot run and the unauthorized persons cannot use it.

Therefore, it is urgently needed to provide an anti-tampering mechanism to prevent unauthorized disassembly of electronic products. Therefore, there is room for improvement within the art.

BRIEF DESCRIPTION OF THE DRAWINGS

Implementations of the present technology will now be described, by way of example only, with reference to the attached figures.

DETAILED DESCRIPTION

Figure 1:
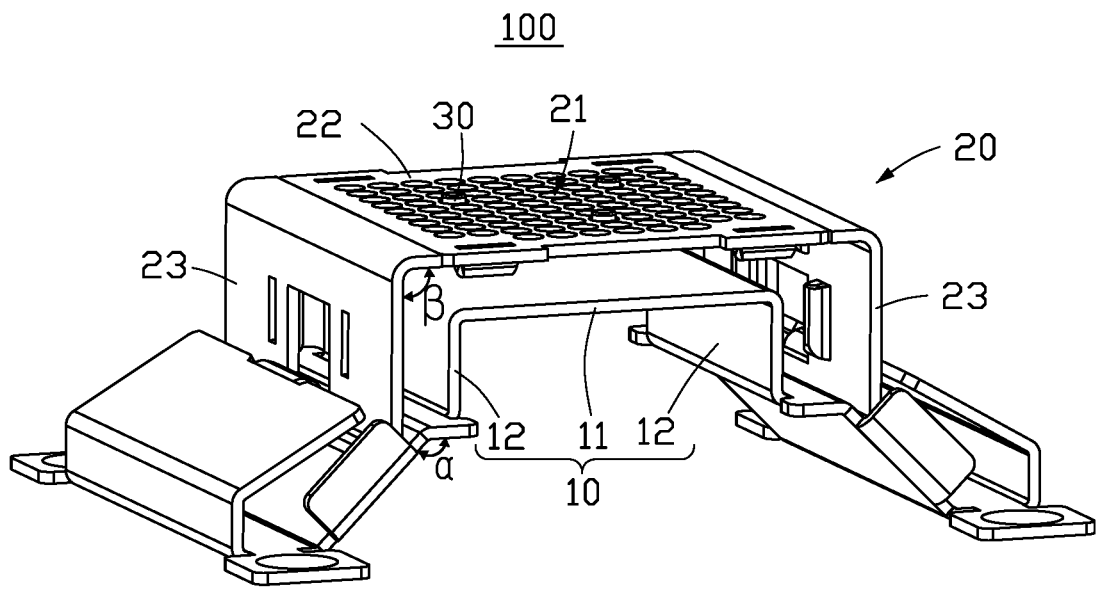
FIG. 1 is a perspective view of an anti-tampering mechanism according to an embodiment of the disclosure.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. Also, the description is not to be considered as limiting the scope of the embodiments described herein. The drawings are not necessarily to scale and the proportions of certain parts have been exaggerated to better illustrate details and features of the disclosure.

The term "inside" indicates that at least a portion of a region is partially contained within a boundary formed by the object. The term "comprising," when utilized, means "including, but not necessarily limited to"; it specifically indicates open-ended inclusion or membership in the so-described combination, group, series, and the like.

"Above" means one layer is located on top of another layer. In one example, it means one layer is situated directly on top of another layer. In another example, it means one layer is situated over the second layer with more layers or spacers in between.

When a feature or element is herein referred to as being "on" another feature or element, it can be directly on the other feature or element or intervening features and/or elements may also be present. It will also be understood that, when a feature or element is referred to as being "connected", "attached" or "coupled" to another feature or element, it can be directly connected, attached, or coupled to the other feature or element or intervening features or elements may be present.

Several definitions that apply throughout this disclosure will now be presented.

Figure 2:
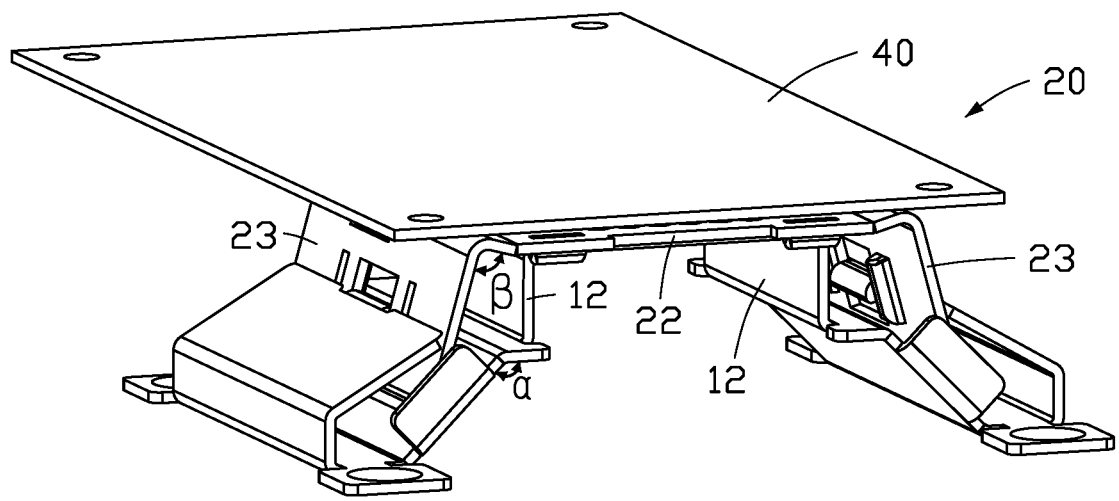
FIG. 2 shows the anti-tampering mechanism of FIG. 1 in use.

Referring to FIG. 1 and FIG. 2, according to an embodiment, an anti-tampering mechanism 100 is provided, which includes a first bracket 10, a second bracket 20, and multiple conductive members 30. In specific, the second bracket 20 is moveably covered on the first bracket 10, and the second bracket 20 defines a plurality of receptacles 21 at a side of the second bracket 20 away from the first bracket 10. Each of the multiple conductive members 30 is randomly disposed in one of the plurality of receptacles 21, and the number of conductive members 30 is less than the number of receptacles 21. Therefore, some of the receptacles 21 contain conductive members 30, while others are empty.

Referring to FIG. 2, when a circuit board 40 presses against the second bracket 20 to move toward the first bracket 10, the circuit board 40 contacts with the conductive members 30 in the receptacles 21, forming an electrical connection, and the conductive members 30 are clamped between the second bracket 20 and the circuit board 40. In specific, the second bracket 20 is deformed to move toward the first bracket 10. When the circuit board 40 releases the second bracket 20, the second bracket 20 returns to its original state and moves away from the first bracket 10, causing the conductive members 30 to pop out of the receptacles 21.

It is scarcely possible to place the conductive members 30 in their original position as the number of conductive members 30 is less than the number of receptacles 21 and each conductive member 30 is randomly disposed in one of the plurality of receptacles 21.

It should be noted that, in the illustrated embodiment, three conductive members 30 and ninety-six receptacles are shown. There are 142,880 possible ways to place 3 conductive members in 96 receptacles. Therefore, the probability of the unauthorized person guessing correctly is 1/142,880. In other embodiments, since the number of conductive members 30 is less than the number of receptacles 21, the purpose of tamper prevention can be achieved. For example, the number of receptacles 21 may be more than 8 and the number of conductive members 30 may be 1 or more than 1. Alternatively, a ratio of the number of conductive members 30 and the number of the receptacles 21 may be in a range from 1/10 to 1/9.

Referring to FIG. 1 and FIG. 2, according to an embodiment, an anti-tampering mechanism 100 is provided, which includes a first bracket 10, a second bracket 20, and multiple conductive members 30. In specific, the first bracket 10 includes a roof 11 and two side walls 12 connected to opposite sides of the roof 11, each side wall 12 forms a first angle α with the roof 11. The second bracket 20 includes a main body 22 and two supporting plates 23 connected to opposite sides of the main body 22, each supporting plate 23 forms a second angle β with the main body 22, β<α. The two supporting plates 23 are supported on the two side walls 12 respectively to maintain the main body 22 to be above the roof 11, such that the second bracket 20 is movably disposed on the first bracket 10. The main body 22 defines a plurality of receptacles 21 on a side of the main body 22 away from the roof 11. Each of the multiple conductive members 30 is randomly disposed in one of the plurality of receptacles 21, and the number of conductive members 30 is less than the number of receptacles 21. Therefore, some of the receptacles 21 contain conductive members 30, while others are empty.

Referring to FIG. 2, when a circuit board 40 presses against the second bracket 20 to move toward the first bracket 10, the circuit board 40 contacts with the conductive members 30 in the receptacles 21, forming an electrical connection, and the conductive members 30 are clamped between the second bracket 20 and the circuit board 40. In specific, the second bracket 20 is deformed, the main body 22 is pressed to move toward the roof 11, the supporting plates 23 slide along the side wall 12 and rotate relative to the main body 22, the second angle β increases during the movement. When the circuit board 40 releases the second bracket 20, the second bracket 20 returns to its original state, the main body 22 moves away from the roof 11 of the first bracket 10, the supporting plates 23 slide back along the side wall 12 and rotate relative to the main body 22, the second angle β decreases during the movement, causing the conductive members to pop out of the receptacles 21.

It is scarcely possible to place the conductive members 30 in their original position as the number of conductive members 30 is less than the number of receptacles 21 and each conductive member 30 is randomly disposed in one of the plurality of receptacles 21.

Figure 3:
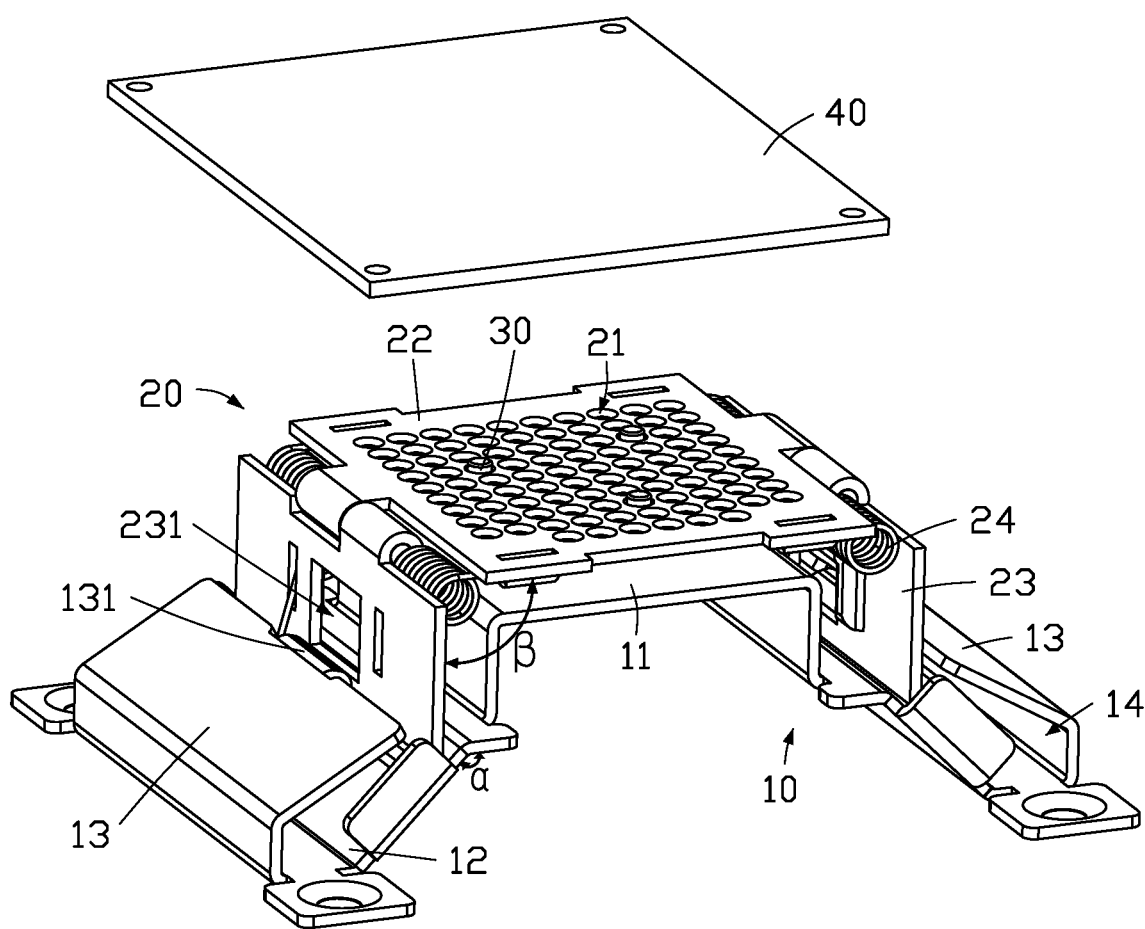
FIG. 3 is a perspective view of an anti-tampering mechanism according to another embodiment of the disclosure.
Figure 4:
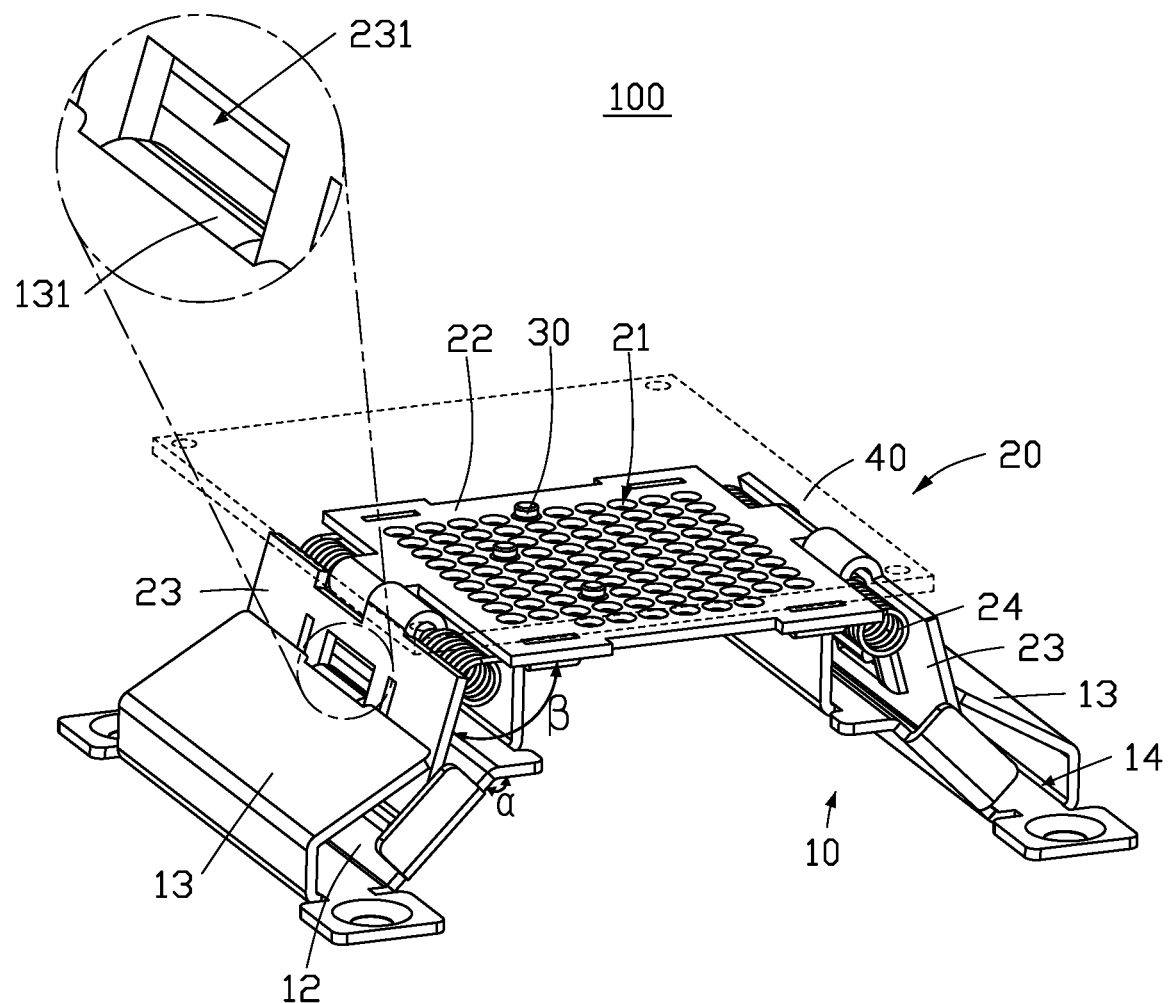
FIG. 4 shows the anti-tampering mechanism of FIG. 3 in use.

Referring to FIG. 3 and FIG. 4, an anti-tampering mechanism 100 according to a further embodiment is provided. For the purposes of illustration, the circuit board 40 is shown as transparent in FIG. 4. In this embodiment, the first angel α is in a range from 120° to 170°. Each supporting plate 23 is rotatably connected to the main body 22 by a resilient member 24.

When the circuit board 40 presses against the second bracket 20 to move toward the first bracket 10, the supporting plates 23 slide along the side wall 12, rotate relative to the main body 22, generating an elastic force for the resilient members 24, and the second angle β increases. When the circuit board 40 releases the second bracket 20, the elastic force of the resilient members 24 pull the supporting plates 23 to restore, the second angle β decreases, the main body 22 is pushed away from the roof 11, and the second bracket 20 returns to its original state. Then the second bracket 20 is ejected from the first bracket 10, causing the conductive members 30 to pop out of the receptacles 21 by inertia of the second bracket 20.

In this embodiment, the main body 22 of the second bracket 20 is held above the roof 11 and spaced from the roof 11, and the main body 22 is parallel to the roof 11. When the circuit board 40 presses the second bracket 20, the second bracket 20 deforms, the main body 22 moves toward the roof 11 until abutting the roof 11.

Alternatively, in further embodiments, each side wall 12 is provided with a positioning plate 13, and the side wall 12 is connected to the positioning plate 13 at an end away from the second bracket 20 to define a positioning groove 14, the positioning groove 14 is used to receive the supporting plate 23 when the second bracket 20 is pressed against the first bracket 10 by the circuit board 40.

Alternatively, in further embodiments, a snap-fastener 131 is provided in the positioning plate 13, which extends into the positioning groove 14, and a locking groove 231 is defined at the supporting plate 23 corresponding to the snap-fastener 131. When the second bracket 20 is pressed against the first bracket 10 by the circuit board 40, the snap-fastener 131 is inserted into the locking groove 231.

Thus, when the second bracket 20 is pressed and deformed by the circuit board, the snap-fastener 131 extends into the locking groove 231 and engaged with the supporting plate 23 through the locking groove 231. When the circuit board 40 is removed from the second bracket 20, the elastic force of the resilient member 24 pulls the supporting plate 23 back to its original position. As the snap-fastener 131 is engaged with the supporting plate 23 through the locking groove 231, the second bracket 20 can be prevented from being detached from the first bracket 10 while the conductive member is being ejected from the receptacle 21.

Figure 5:
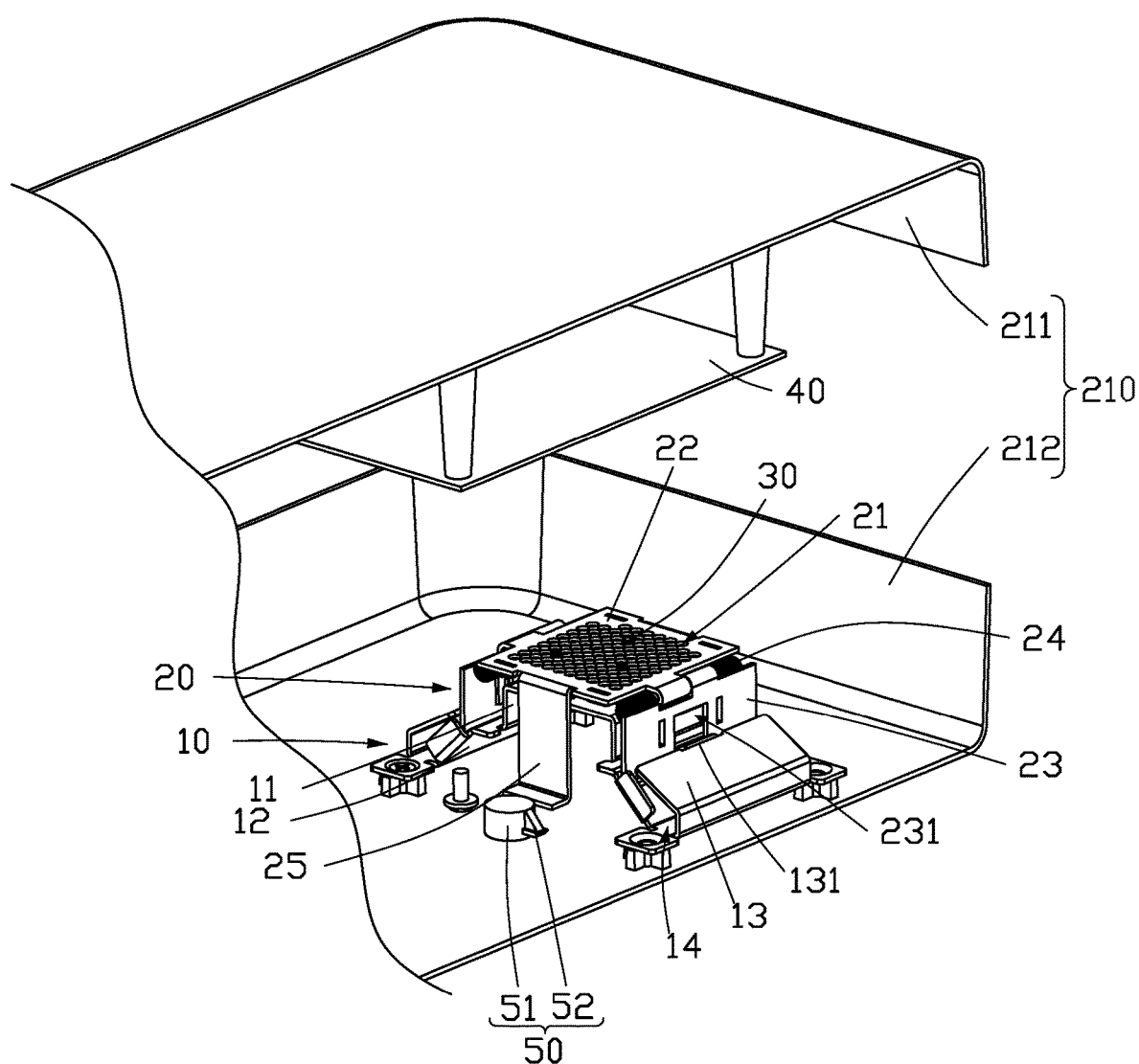
FIG. 5 is a perspective view of an electronic device according to an embodiment of the disclosure.
Figure 6:
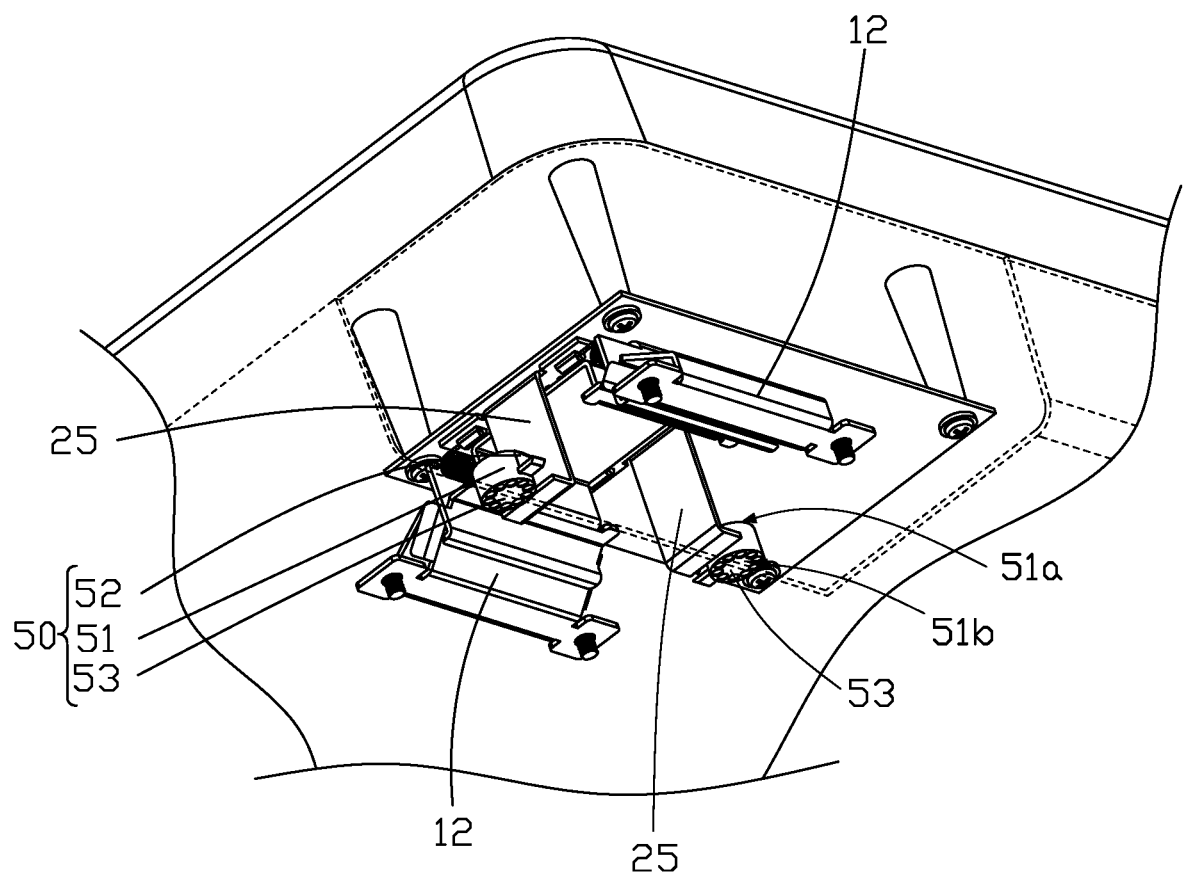
FIG. 6 is a perspective view of the electronic device in FIG. 5 from another view.

In other embodiments, as shown in FIG. 5 and FIG. 6, an electronic device 200 is provided. The electronic device 200 includes an anti-tampering mechanism 100, a casing 210, and a circuit board 40. The casing 210 includes an upper cover 211 and a lower cover 212 that engage with each other. The circuit board 40 is located inside the casing 210 and between the upper cover 211 and the lower cover 212, and is installed on the upper cover 211. The anti-tampering mechanism 100 is located inside the casing 210 and includes a first bracket 10, a second bracket 20, and multiple conductive members 30. The first bracket 10 is fixed on the lower cover 212. The second bracket 20 is movably covered on the first bracket 10 and is located between the first bracket 10 and the circuit board 40. The second bracket 20 defines multiple receptacles 21 on a side away from the first bracket 10, with each conductive member 30 randomly placed in one receptacle 21, and the number of conductive members 30 is less than the number of receptacles 21, resulting in some receptacles 21 containing conductive members 30 while others being empty.

When the upper cover 211 and the lower cover 212 are engaged, the circuit board 40 on the upper cover 211 presses against the second bracket 20 to deform to move toward the first bracket 10. The conductive members 30 are clamped between the second bracket 20 and the circuit board 40, and electrically connected to the circuit board 40 to generate a first signal sequence. The electronic device 200 can work normally when the first signal sequence is detected. When the upper cover 211 together with the circuit board 40 are removed from the lower cover 212, the second bracket 20 restores its original shape and moves away from the first bracket 10, causing the conductive members 30 to pop out of the receptacles 21.

In operation, the anti-tamper mechanism 100 is placed in the casing 210 of the electronic device 200 and the conductive members 30 are randomly placed in the receptacles 21, the circuit board 40 installed on the upper cover 211 is pressed against the second bracket 20, causing the second bracket 20 to deform and move closer to the first bracket 10. The conductive members 30 in the receptacles 21 are clamped between the second bracket 20 and the circuit board 40 and electrically connected to the circuit board to generate a first signal sequence. The electronic device 200 can work normally when the first signal sequence is detected. The first signal sequence can be stored in a storage element on the circuit board 40 (not shown in the figure). When an unauthorized person dissembles the electronic device 200, the upper cover 211 is disengaged from the lower cover 212, the second bracket 20 restores its original shape and moves away from the first bracket 10, and the conductive members 30 are pop out of the receptacles 21 due to loss of double-sided compression from the circuit board 40 and the second bracket 20.

Since the conductive members 30 are randomly arranged in the receptacles 21, it is scarcely possible for the unauthorized person to place the conductive members 30 in their original position as the number of conductive members 30 is less than the number of receptacles 21 and each conductive member 30 is randomly disposed in one of the plurality of receptacles 21. After reassembling the electronic device 200 and turning it on, there is a high probability that the position of the conductive members 30 will be different from the original position, resulting in a second signal sequence that different from the first signal sequence. The electronic device will not work normally when the second signal sequence is detected, preventing the unauthorized person from continuing to use the electronic device 200, such that the purpose of preventing unauthorized disassembly or tampering is achieved.

It should be noted that, in the illustrated embodiment, three conductive members 30 and ninety-six receptacles are shown. There are 142,880 possible ways to place 3 conductive members in 96 receptacles. Therefore, the probability of the unauthorized person guessing correctly is 1/142,880. In other embodiments, since the number of conductive members 30 is less than the number of receptacles 21, the purpose of tamper prevention can be achieved. For example, the number of receptacles 21 may be more than 8 and the number of conductive members 30 may be 1 or more than 1. Alternatively, a ratio of the number of conductive members 30 and the number of the receptacles 21 may be in a range from 1/10 to 1/9.

In other embodiments, as shown in FIG. 5 and FIG. 6, an electronic device 200 is provided. The electronic device 200 includes an anti-tampering mechanism 100, a casing 210, and a circuit board 40. The casing 210 includes an upper cover 211 and a lower cover 212 that engage with each other. The circuit board 40 is located inside the casing 210 and between the upper cover 211 and the lower cover 212, and is installed on the upper cover 211. The anti-tampering mechanism 100 is located inside the casing 210 and includes a first bracket 10, a second bracket 20, and multiple conductive members 30. The first bracket 10 is fixed on the lower cover 212. The second bracket 20 is movably covered on the first bracket 10 and is located between the first bracket 10 and the circuit board 40. The second bracket 20 defines multiple receptacles 21 on a side away from the first bracket 10, with each conductive member 30 randomly placed in one receptacle 21, and the number of conductive members 30 is less than the number of receptacles 21, resulting in some receptacles 21 containing conductive members 30 while others being empty.

In specific, the first bracket 10 includes a roof 11 and two side walls 12 connected to opposite sides of the roof 11, the first bracket 10 is connected to the lower cover 212 by the two side walls 12, each side wall 12 forms a first angle $\alpha$ with the roof 11. The second bracket 20 includes a main body 22 and two supporting plates 23 connected to opposite sides of the main body 22, each supporting plate 23 forms a second angle $\beta$ with the main body 22, $\beta<\alpha$. The two supporting plates 23 are supported on the two side walls 12 respectively to maintain the main body 22 to be above the roof 11, such that the second bracket 20 is movably disposed on the first bracket 10. The main body 22 defines a plurality of receptacles 21 on a side of the main body 22 away from the roof 11.

When the upper cover 211 and the lower cover 212 are engaged, the circuit board 40 on the upper cover 211 presses against the second bracket 20, the main body 22 of the second bracket 20 is pressed to move toward the roof 11 of the first bracket 10, the supporting plates 23 slide along the side wall 12 and rotate relative to the main body 11, the second angle $\beta$ increases during the movement, then the second bracket 20 is deformed, and the conductive members 30 are clamped between the second bracket 20 and the circuit board 40, and electrically connected to the circuit board 40 to generate a first signal sequence. The electronic device 200 can work normally when the first signal sequence is detected. When the upper cover 211 together with the circuit board 40 are removed from the lower cover 212, the second bracket 20 restores its original shape and moves away from the first bracket 10, the main body 22 moves away from the roof 11 of the first bracket 10, the supporting plates 23 slide back along the side wall 12 and rotate relative to the main body 22, the second angle $\beta$ decreases during the movement, causing the conductive members 30 to pop out of the receptacles 21.

According to further embodiments, the first angel $\alpha$ is in a range from 120° to 170°. Each supporting plate 23 is rotatably connected to the main body 22 by a resilient member 24. When the circuit board 40 presses against the second bracket 20 to move toward the first bracket 10, the supporting plates 23 slide along the side wall 12, rotate relative to the main body 22, generating an elastic force for the resilient members 24, and the second angle $\beta$ increases. When the circuit board 40 releases the second bracket 20, the elastic force of the resilient members 24 pull the supporting plates 23 to restore, the second angle $\beta$ decreases, the main body 22 is pushed away from the roof 11, and the second bracket 20 returns to its original state. Then the second bracket 20 is ejected from the first bracket 10, causing the conductive members 30 to pop out of the receptacles 21 by inertia of the second bracket 20.

In this embodiment, the main body 22 of the second bracket 20 is held above the roof 11 and spaced from the roof 11. When the circuit board 40 presses the second bracket 20, the second bracket 20 deforms, the main body 22 moves toward the roof 11 until abutting the roof 11.

Alternatively, in further embodiments, each side wall 12 is provided with a positioning plate 13, and the side wall 12 is connected to the positioning plate 13 at an end away from the second bracket 20 to define a positioning groove 14, the positioning groove 14 is used to receive the supporting plate 23 when the second bracket 20 is pressed against the first bracket 10 by the circuit board 40.

Alternatively, in further embodiments, a snap-fastener 131 is provided on the positioning plate 13, which extends into the positioning groove 14, and a locking groove 231 is defined on the supporting plate 23 corresponding to the snap-fastener 131. When the second bracket 20 is pressed against the first bracket 10 by the circuit board 40, the snap-fastener 131 is engaged in the locking groove 231.

Thus, when the second bracket 20 is pressed and deformed by the circuit board, the snap-fastener 131 extends into the locking groove 231 and engaged with the supporting plate 23 through the locking groove 231. When the circuit board 40 is removed from the second bracket 20, the elastic force of the resilient member 24 pulls the supporting plate 23 back to its original position. As the snap-fastener 131 is engaged with the supporting plate 23 through the locking groove 231, the second bracket 20 can be prevented from being detached from the first bracket 10 while the conductive member is being ejected from the receptacle 21.

In other embodiments, the second bracket 20 further includes two fixing plates 25 connected to the main body 22 on both sides, and each fixing plate 25 located between two side walls 12 when the second bracket 20 covered on the first bracket 10. The electronic device 200 further includes two rotating members 50 rotatably mounted on the lower cover 212. The rotating members 50 are located on both sides of the anti-tamper mechanism 100, adjacent to the two fixing plates 25 respectively, and the rotating members 50 rotate to abut against the fixing plates 25 when the second bracket 20 is pressed against the first bracket 10 by the circuit board 40, thereby fixing the second bracket 20 to the lower cover 212.

Thus, when the upper cover 211 and the lower cover 212 are separated, the circuit board 40 leaves the second bracket 20, the second bracket 20 fixed by the rotating members 50 will not move or return to its original state, and the conductive member 30 will not pop out of the accommodating groove 21. After the upper cover 211 and the lower cover 212 are reconnected, the first signal sequence can be generated again, and the electronic device 200 can work normally.

In other embodiments, the rotating member 50 includes a rotating body 51 and an arm 52 connected to the rotating body 51. The rotating body 51 is rotatably mounted on the lower cover 212, and the rotating body 51 rotates to move the arm 52 to abut against the fixing plate 25.

In other embodiments, as shown in FIG. 6, a first end 51a of the rotating body 51 is located inside the casing 210 and connected to the arm 52, and a second end 51b of the rotating body 51 extends through the lower cover 212 to be accessible from outside of the casing 210. The second end 51b of the rotating body 51 is provided with an encryption structure 53. The encryption structure 53 is used to control the rotation of the rotating body 51. For illustration purposes, the lower cover 212 in FIG. 6 is shown as transparent and partially cut.

Thus, when an authorized person needs to disassemble the electronic device 200, he can use a password or a special tool (not shown) to rotate of the rotating body 51 from the outside of the housing 210 through the encryption structure 53, so that the arm 52 abuts against the fixing plate 25, avoiding the second bracket 20 from ejecting the conductive member 30 during disassembly. Unauthorized person cannot rotate the rotating body 51 through the encryption structure 53 without a password or a special tool, thus preventing unauthorized person from continuing to use the electronic device 200, achieving anti-tampering and allowing authorized person to disassemble and continue to use the electronic device 200.

The embodiments shown and described above are only examples. Therefore, many such details are neither shown nor described. Even though numerous characteristics and advantages of the present technology have been set forth in the foregoing description, together with details of the structure and function of the disclosure, the disclosure is illustrative only, and changes may be made in the detail, especially in matters of shape, size and arrangement of the parts within the principles of the disclosure up to, and including the full extent established by the broad general meaning of the terms used in the claims. It will therefore be appreciated that the embodiments described above may be modified within the scope of the claims.

What is claimed is:

1. An anti-tampering mechanism comprising:
a first bracket;
a second bracket moveably covered on the first bracket, the second bracket defining a plurality of receptacles at a side away from the first bracket; and
a conductive member randomly disposed in one of the plurality of receptacles;
wherein the second bracket is configured to deform to move toward the first bracket under pressure of a circuit board, the circuit board contacts with the conductive member, forming an electrical connection, and the second bracket is further configured to restore to move away from the first bracket after the pressure of the circuit board is removed, causing the conductive member to pop out of the one of the plurality of receptacles.

2. The anti-tampering mechanism of claim 1, further comprising multiple conductive members, wherein the multiple conductive members are randomly disposed in the plurality of receptacles, each of the multiple conductive members is placed in one of the plurality of receptacles, a number of the multiple conductive members is less than a number of the plurality of receptacles.

3. The anti-tampering mechanism of claim 2, wherein
the first bracket comprises a roof and two side walls connected to opposite sides of the roof, each of the two side walls forms a first angle with the roof;
the second bracket comprises a main body and two supporting plates connected to opposite sides of the main body, each of the two supporting plates forms a second angle with the main body, the second angle is less than the first angle, the two supporting plates are supported on the two side walls respectively to hold the main body to be above the roof, the main body defines the plurality of receptacles at a side of the main body away from the roof; and
the second bracket is configured to deform under pressure of the circuit board, the circuit board contacts with the conductive members in the plurality of receptacles, forming an electrical connection, the main body is pressed to move toward the roof, the supporting plates slide along the two side walls and rotate relative to the main body, causing the second angle to increase; the second bracket is further configured to restore after the pressure of the circuit board is removed, the main body moves away from the roof of the first bracket, the supporting plates slide back along the two side walls and rotate relative to the main body, causing the second angle to decrease, and causing the conductive members to pop out of the receptacles.

4. The anti-tampering mechanism of claim 3, wherein
the first angel is in a range from 120° to 170°;
each of the two supporting plate is rotatably connected to the main body by a resilient member;
the resilient member is configured for generating an elastic force when the second bracket deforms, and the resilient member is further configured for pulling the supporting plates to slide back along the two side walls to restore the second bracket when the pressure of the circuit board is removed.

5. The anti-tampering mechanism of claim 4, wherein
each of the two side walls is provided with a positioning plate, and the side wall is connected to the positioning plate at an end away from the second bracket to define a positioning groove, the positioning groove receives one of the supporting plates when the second bracket is pressed against the first bracket by the circuit board.

6. The anti-tampering mechanism of claim 5, wherein
each of the two positioning plates is provided with a snap-fastener extending into the positioning groove; and
each of the two supporting plates defines a locking groove, the snap-fastener inserts into the locking groove when the supporting plates slide along the two side walls.

7. An electronic device comprising:
a casing comprising an upper cover and a lower cover engage with each other;
a circuit board installed on the upper cover, the circuit board is located between the upper cover and the lower cover; and
an anti-tampering mechanism comprising:
a first bracket received inside the casing and fixed on the lower cover;
a second bracket moveably covered on the first bracket, the second bracket is located between the first bracket and the circuit board, the second bracket defines a plurality of receptacles at a side away from the first bracket; and
a conductive member randomly disposed in one of the plurality of receptacles;
wherein the second bracket is configured to deform to move toward the first bracket under pressure of the circuit board when the upper cover is engaged with the lower cover, the circuit board contacts with the conductive member, generating a first signal sequence; and
the second bracket is further configured to restore to move away from the first bracket after the upper cover is disengaged from the lower cover and the pressure of the circuit board is removed, causing the conductive member to pop out of the one of the plurality of receptacles.

8. The electronic device of claim 7, wherein the anti-tampering mechanism further comprises multiple conductive members, the multiple conductive members are randomly disposed in the plurality of receptacles, each of the multiple conductive members is placed in one of the plurality of receptacles, a number of the multiple conductive members is less than a number of the plurality of receptacles.

9. The electronic device of claim 8, wherein
the first bracket comprises a roof and two side walls connected to opposite sides of the roof, the first bracket is connected to the lower cover by the two side walls, each of the two side walls forms a first angle with the roof;
the second bracket comprises a main body and two supporting plates connected to opposite sides of the main body, each of the two supporting plates forms a second angle with the main body, the second angle is less than the first angle, the two supporting plates are supported on the two side walls respectively to hold the main body to be above the roof, the main body defines the plurality of receptacles at a side of the main body away from the roof; and
the second bracket is configured to deform under pressure of the circuit board when the upper cover is engaged with the lower cover, the circuit board contacts with the conductive members in the receptacles, generating a first signal sequence, the main body is pressed to move toward the roof, the supporting plates sliding along the two side walls and rotating relative to the main body, causing the second angle to increase;
the second bracket is further configured to restore after the upper cover is disengaged from the lower cover and the pressure of the circuit board is removed, the main body moves away from the roof of the first bracket, the second angle decreases when the supporting plates sliding back along the two side walls and rotating relative to the main body, causing the conductive members to pop out of the receptacles.

10. The electronic device of claim 9, wherein
the first angel is in a range from 120° to 170°;
each of the two supporting plates is rotatably connected to the main body by a resilient member;
the resilient member is configured for generating an elastic force when the second bracket deforms, and the resilient member is further configured for pulling the supporting plates to slide back along the two side walls to restore the second bracket when the pressure of the circuit board is removed.

11. The electronic device of claim 10, wherein
each of the two side walls is provided with a positioning plate, and the side wall is connected to the positioning plate at an end away from the second bracket to define a positioning groove, the positioning groove receives one of the supporting plates when the second bracket is pressed against the first bracket by the circuit board.

12. The electronic device of claim 11, wherein
each of the two positioning plates is provided with a snap-fastener extending into the positioning groove; and
each of the two supporting plates defines a locking groove, the snap-fastener inserts into the locking groove when the supporting plates slide along the two side walls.

13. The electronic device of claim 11, wherein
the second bracket further comprises two fixing plates connected to the main body on both sides, and each of the two fixing plates is located between the two side walls when the second bracket covered on the first bracket;
the electronic device further comprises two rotating members rotatably mounted on the lower cover, the two rotating members are located on both sides of the anti-tamper mechanism, adjacent to the two fixing plates respectively, and the rotating members rotate to abut against the fixing plates to fix the second bracket to the lower cover when the second bracket is pressed against the first bracket by the circuit board.

14. The electronic device of claim 13, wherein
each of the rotating members comprises a rotating body and an arm connected to the rotating body, the rotating body is rotatably mounted on the lower cover, and the rotating body rotates to move the arm to abut against the fixing plate.

15. The electronic device of claim 14, wherein
a first end of the rotating body is located inside the casing and connected to the arm, and a second end of the rotating body extends through the lower cover to be accessible from outside of the casing; and
the second end of the rotating body is provided with an encryption structure for controlling rotation of the rotating body.

* * * * *